(12) United States Patent
Suzuki et al.

(10) Patent No.: US 9,224,903 B2
(45) Date of Patent: Dec. 29, 2015

(54) METHOD FOR MANUFACTURING PHOTOELECTRIC CONVERTER

(71) Applicant: KYOCERA Corporation, Kyoto-shi, Kyoto (JP)

(72) Inventors: Takeshi Suzuki, Toyohashi (JP); Riichi Sasamori, Omihachiman (JP); Junji Aranami, Otsu (JP); Hirofumi Senta, Konan (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/395,419

(22) PCT Filed: Mar. 11, 2013

(86) PCT No.: PCT/JP2013/056631
§ 371 (c)(1),
(2) Date: Oct. 17, 2014

(87) PCT Pub. No.: WO2013/157321
PCT Pub. Date: Oct. 24, 2013

(65) Prior Publication Data
US 2015/0118789 A1 Apr. 30, 2015

(30) Foreign Application Priority Data

Apr. 17, 2012 (JP) .................. 2012-094058
May 24, 2012 (JP) .................. 2012-118475
Aug. 23, 2012 (JP) .................. 2012-183993
Sep. 10, 2012 (JP) .................. 2012-198143

(51) Int. Cl.
*H01L 21/00* (2006.01)
*H01L 31/18* (2006.01)
(Continued)

(52) U.S. Cl.
CPC ............ *H01L 31/18* (2013.01); *H01L 31/0322* (2013.01); *H01L 31/0326* (2013.01); *H01L 31/03923* (2013.01); *H01L 31/0749* (2013.01); *Y02E 10/541* (2013.01)

(58) Field of Classification Search
CPC ............ H01L 31/0264; H01L 31/0256; H01L 31/0296; H01L 31/0328; H01L 31/0392; H01L 31/03921; H01L 31/03925; H01L 31/03923; H01L 31/0445; H01L 31/046; H01L 31/0468; H01L 31/073; H01L 31/1828; H01L 31/0749
USPC ........... 257/78, 103, 189, 201, 472, 614, 615, 257/631, 744; 438/45, 46, 85, 86, 93, 94, 438/95, 104, 572, 584, 602, 603, 609, 622, 438/623, 758, 761, 765, 767, 768
See application file for complete search history.

(56) References Cited

U.S. PATENT DOCUMENTS 7,018,858 B2 * 3/2006 Aoki et al. ................. 438/22
2004/0159854 A1 * 8/2004 Koinuma et al. ............ 257/200
(Continued)

FOREIGN PATENT DOCUMENTS

JP 2000-299486 A 10/2000
JP 2007-269589 A 10/2007
(Continued)

OTHER PUBLICATIONS

International Search Report (Form PCT/ISA/210) dated Jun. 18, 2013 issued for PCT/JP2013/056631.
(Continued)

*Primary Examiner* — Thanh Y Tran
(74) *Attorney, Agent, or Firm* — Procopio, Cory, Hargreaves & Savitch LLP

(57) ABSTRACT

A method for manufacturing a photoelectric converter, comprising: forming a first buffer layer comprising a metal sulfide on a light-absorbing layer comprising a Group I-III-VI compound or a Group I-II-IV-VI compound; and contacting a surface of the first buffer layer with a first solution comprising an alkali metal compound.

6 Claims, 10 Drawing Sheets

(51) Int. Cl.
*H01L 31/0392* (2006.01)
*H01L 31/0749* (2012.01)
*H01L 31/032* (2006.01)

(56) References Cited

U.S. PATENT DOCUMENTS

| | | |
|---|---|---|
| 2005/0028861 A1 | 2/2005 | Aoki et al. |
| 2005/0095809 A1 | 5/2005 | Nakayama et al. |
| 2009/0315046 A1* | 12/2009 | Miki et al. ............ 257/94 |
| 2010/0267190 A1* | 10/2010 | Hakuma et al. ............ 438/95 |
| 2011/0027938 A1* | 2/2011 | Ahn ............ 438/93 |
| 2011/0186955 A1* | 8/2011 | Kawano et al. ............ 257/463 |
| 2011/0303879 A1* | 12/2011 | Fukano et al. ............ 252/501.1 |
| 2012/0132281 A1* | 5/2012 | Yang et al. ............ 136/260 |
| 2014/0366941 A1* | 12/2014 | Jee ............ 136/256 |
| 2014/0366942 A1* | 12/2014 | Lee ............ 136/256 |

FOREIGN PATENT DOCUMENTS

| | | |
|---|---|---|
| WO | 03/009394 A1 | 1/2003 |
| WO | 03/069684 A1 | 8/2003 |

OTHER PUBLICATIONS

Office Action dated Mar. 14, 2015 issued in counterpart Japanese application No. 2014-511141.

\* cited by examiner

METHOD FOR MANUFACTURING PHOTOELECTRIC CONVERTER

TECHNICAL FIELD

The present invention relates to methods for manufacturing photoelectric converters including a semiconductor layer containing a Group I-III-VI compound or a Group I-II-IV-VI compound.

BACKGROUND ART

There are photoelectric converters, particularly for photovoltaics, including a light-absorbing layer of a Group I-III-VI compound such as CIG or CIGS or a Group I-II-IV-VI compound such as CZTS. Examples of such photoelectric converters are disclosed in Japanese Unexamined Patent Application Publication Nos. 2000-299486 and 2007-269589.

A photoelectric converter including such a light-absorbing layer is composed of a plurality of photoelectric cells arranged side by side in a plane. Each photoelectric cell includes, in sequence on a substrate such as a glass substrate, a lower electrode layer such as a metal electrode, a photoelectric layer composed of layers such as a light-absorbing layer and a buffer layer, and an upper electrode layer such as a transparent electrode or a metal electrode. The photoelectric cells are electrically connected in series such that the upper electrode layer of one photoelectric cell is electrically connected to the lower electrode layer of another photoelectric cell adjacent thereto via a connection conductor.

There is a constant need for an improvement in the photoelectric conversion efficiency of a photoelectric converter. The photoelectric conversion efficiency is the proportion of solar energy converted into electrical energy by the photoelectric converter. For example, the photoelectric conversion efficiency is derived as the electrical energy, produced by the photoelectric converter, divided by the solar energy incident on the photoelectric converter and multiplied by 100.

In view of the foregoing, an object of the present invention is to improve the photoelectric conversion efficiency of a photoelectric converter.

SUMMARY OF INVENTION

A method for manufacturing a photoelectric converter according to an embodiment of the present invention includes: forming a first buffer layer containing a metal sulfide on a light-absorbing layer containing a Group I-III-VI compound or a Group I-II-IV-VI compound; and contacting a surface of the first buffer layer with a first solution containing an alkali metal compound.

The above embodiment of the present invention can provide a photoelectric converter with high photoelectric conversion efficiency.

DESCRIPTION OF EMBODIMENTS

Figure 1:
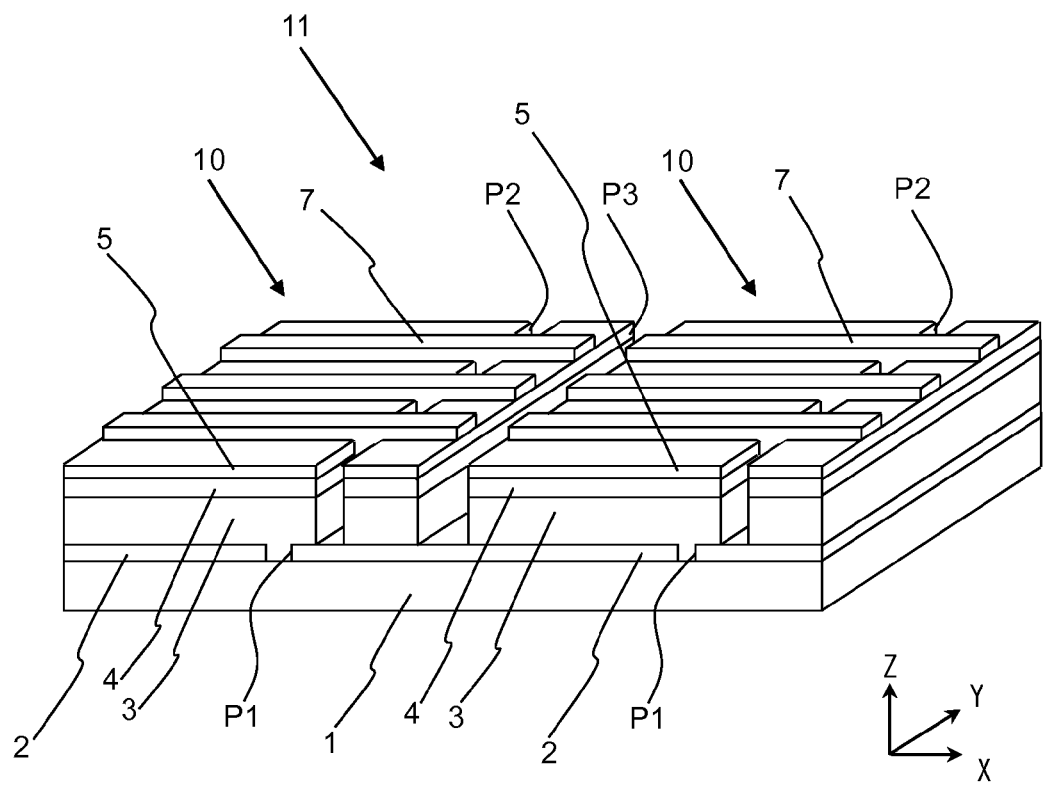
FIG. 1 is a perspective view of an example photoelectric converter fabricated by a method for manufacturing a photoelectric converter according to an embodiment of the present invention.

A method for manufacturing a photoelectric converter according to an embodiment of the present invention will now be described in detail with reference to the drawings. In the drawings, parts having like structures and functions are indicated by the same reference signs, and a redundant explanation thereof will be omitted in the following description. The drawings are depicted schematically, and the sizes, positional relationship, etc. of various structures in the drawings are not drawn to scale.

<(1) Structure of Photoelectric Converter>

Figure 2:
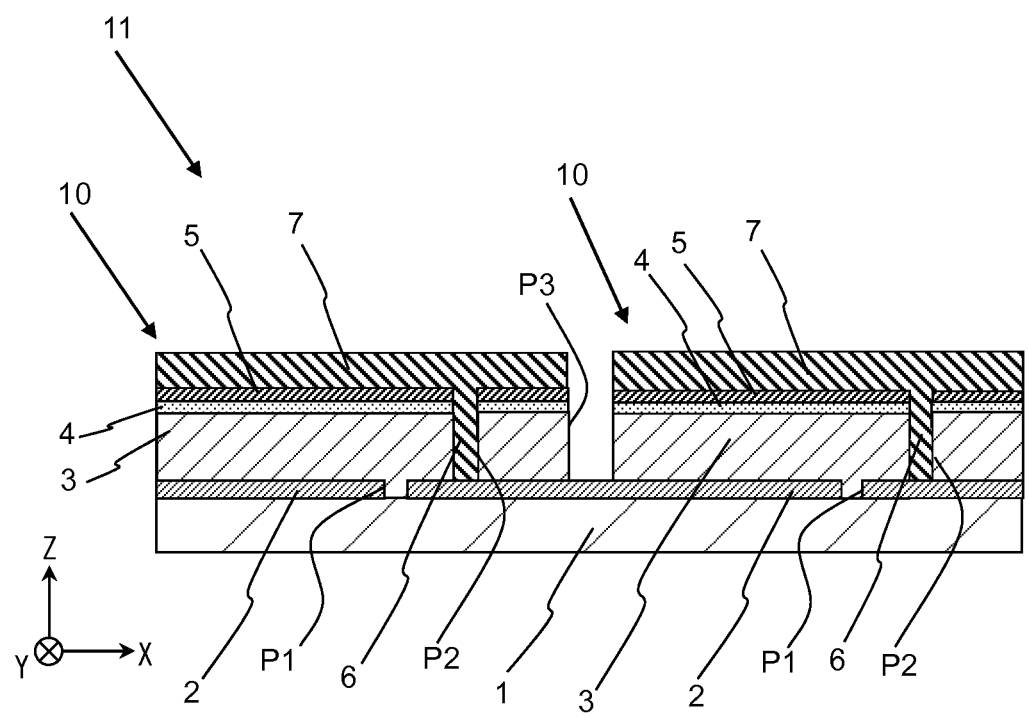
FIG. 2 is a sectional view of the photoelectric converter in FIG. 1.

FIG. 1 is a perspective view of an example photoelectric converter 11 fabricated by a method for manufacturing a photoelectric converter according to an embodiment of the present invention. FIG. 2 is an XZ sectional view of the photoelectric converter 11 in FIG. 1. FIGS. 1 to 10 show a right-handed XYZ coordinate system whose X-axis direction is parallel to the direction in which photoelectric cells 10 are arranged (the left-to-right direction as viewed in FIG. 1).

The photoelectric converter 11 includes a plurality of photoelectric cells 10 arranged side by side on a substrate 1. Although FIG. 1 shows only two photoelectric cells 10 for illustration purposes, a practical photoelectric converter 11 includes a large number of photoelectric cells 10 arranged in the X-axis direction in the drawings, and optionally also in the Y-axis direction in the drawings, i.e., in a plane (in two dimensions).

Each photoelectric cell 10 generally includes a lower electrode layer 2, a light-absorbing layer 3, a first buffer layer 4, an upper electrode layer 5, and collector electrodes 7. The photoelectric converter 11 has a main surface serving as a light-receiving surface on the side where the upper electrode layer 5 and the collector electrodes 7 are disposed. The photoelectric converter 11 has three types of grooves, i.e., first to third grooves P1, P2, and P3.

The substrate 1 supports the photoelectric cells 10 and is made of, for example, a material such as a glass, ceramic, resin, or metal. For example, the substrate 1 may be a soda-lime glass substrate having a thickness of about 1 to 3 mm.

The lower electrode layer 2 is a conductive layer on one main surface of the substrate 1 and is made of, for example, a metal such as molybdenum (Mo), aluminum (Al), titanium (Ti), tantalum (Ta), or gold (Au), or a laminate of such metals. The lower electrode layer 2 has a thickness of about 0.2 to 1 µm and is formed, for example, by a known thin-film forming process such as sputtering or evaporation.

The light-absorbing layer 3 is a semiconductor layer of a first conductivity type (in this embodiment, p-type conductivity) on the main surface on the +Z side (one main surface) of the lower electrode layer 2 and has a thickness of about 1 to 3 µm. The light-absorbing layer 3 is a semiconductor layer based on a Group I-III-VI compound or a Group I-II-IV-VI compound. The term "semiconductor layer based on a Group I-III-VI compound or a Group I-II-IV-VI compound" refers to a semiconductor layer containing a Group I-III-VI compound or a Group I-II-IV-VI compound in an amount of 70 mol % or more.

Group I-III-VI compounds are compounds of Group I-B elements (also known as Group 11 elements), III-B elements (also known as Group 13 elements), and Group VI-B elements (also known as Group 16 elements). Group I-II-IV-VI compounds are compounds of Group I-B elements, Group II-B elements (also known as Group 12 elements), Group IV-B elements (also known as Group 14 elements), and Group VI-B elements.

Examples of Group I-III-VI compounds include $CuInSe_2$ (copper indium diselenide, also known as CIS), $Cu(In,Ga)Se_2$ (copper indium gallium diselenide, also known as CIGS), and $Cu(In,Ga)(Se,S)_2$ (copper indium gallium diselenide/sulfide, also known as CIGSS). The light-absorbing layer 3 may also be a laminate of multiple layers, for example, a CIGS layer overlaid with a surface layer of CIGSS thin film.

Examples of Group I-II-IV-VI compounds include $Cu_2ZnSnS_4$ (also known as CZTS), $Cu_2ZnSn(S,Se)_4$ (also known as CZTSSe), and $Cu_2ZnSnSe_4$ (also known as CZTSe).

The first buffer layer 4 is a semiconductor layer forming a heterojunction with the light-absorbing layer 3. The first buffer layer 4 may have a different conductivity type (in this embodiment, n-type conductivity) from the light-absorbing layer 3. The term "semiconductor of a different conductivity type" refers to a semiconductor having different conduction carriers. If the light-absorbing layer 3 has p-type conductivity, as described above, the first buffer layer 4 may have n-type or i-type conductivity. In other embodiments, the light-absorbing layer 3 may have n-type or i-type conductivity, whereas the first buffer layer 4 may have p-type conductivity.

The first buffer layer 4 is a semiconductor layer containing a metal sulfide and is made of, for example, a compound semiconductor such as cadmium sulfide (CdS), indium sulfide ($In_2S_3$), zinc sulfide (ZnS), In(OH, S), or Zn(OH,S). In(OH,S) is a mixed-crystal compound of $In(OH)_3$ and $In_2S_3$. Zn(OH,S) is a mixed-crystal compound of $Zn(OH)_2$ and ZnS. The first buffer layer 4 may have a resistivity of 1 Ω·cm or more so that less current loss occurs.

The first buffer layer 4 has a thickness in the direction normal to one main surface of the light-absorbing layer 3, which is, for example, 10 to 200 nm.

The upper electrode layer 5 is a transparent conductive film of a second conductivity type (in this embodiment, n-type conductivity) on the first buffer layer 4 and serves as an electrode into which charge generated by the light-absorbing layer 3 is drawn. The upper electrode layer 5 is made of a material having a lower resistivity than the first buffer layer 4. The upper electrode layer 5 encompasses a window layer. If a transparent conductive film is provided in addition to a window layer, they may be assumed to be the upper electrode layer 5 as a whole.

The upper electrode layer 5 is based on a wide-band-gap, transparent, low-resistivity material. Examples of such materials include metal oxide semiconductors such as ZnO, $In_2O_3$, $SnO_2$, and the like. These metal oxide semiconductors may contain elements such as aluminum, boron, gallium, indium, tin, antimony, and fluorine. Specific examples of metal oxide semiconductors containing such elements include aluminum zinc oxide (AZO), boron zinc oxide (BZO), gallium zinc oxide (GZO), indium zinc oxide (IZO), indium tin oxide (ITO), fluorine tin oxide (FTC)), and the like.

The upper electrode layer 5 is formed to a thickness of 0.05 to 3 μm by a process such as sputtering, evaporation, or chemical vapor deposition (CVD). The upper electrode layer 5 may have a resistivity of 1 Ω·cm or less and a sheet resistance of 50 Ω/sq or less so that charge is effectively drawn from the light-absorbing layer 3.

The first buffer layer 4 and the upper electrode layer 5 may be made of a material having the property of readily transmitting light in the wavelength region of light absorbed by the light-absorbing layer 3 (also known as light transparency). This reduces a decrease in the light absorption efficiency of the light-absorbing layer 3 due to the presence of the first buffer layer 4 and the upper electrode layer 5.

The upper electrode layer 5 may have a thickness of 0.05 to 0.5 μm so that it has high light transparency and effectively transfers a current resulting from photoelectric conversion.

The collector electrodes 7 are spaced apart from each other in the Y-axis direction, each extending in the X-axis direction. The collector electrodes 7 are conductive electrodes made of, for example, a metal such as silver (Ag).

The collector electrodes 7 function to collect the charge generated from the light-absorbing layer 3 and drawn into the upper electrode layer 5. If the collector electrodes 7 are provided, a thinner upper electrode layer 5 can be formed.

The charge collected by the collector electrodes 7 and the upper electrode layer 5 is passed to an adjacent photoelectric cell 10 through connection conductors 6 disposed in the second grooves P2. For example, as shown in FIG. 2, the connection conductors 6 are formed by extensions of the collector electrodes 7 in the Z-axis direction. Thus, the collector electrodes 7 of one photoelectric cell 10 in the photoelectric converter 11 are electrically connected in series to the lower electrode layer 2 of another photoelectric cell 10 adjacent thereto via the connection conductors 6 disposed in the second grooves P2. The connection conductors 6, however, may be formed in other manners, for example, by extensions of the upper electrode layer 5.

The collector electrodes 7 may have a width of 50 to 400 μm so that they have good conductivity with a minimum decrease in light-receiving area, which determines the amount of light incident on the light-absorbing layer 3.

<(2) Method for Manufacturing Photoelectric Converter>

FIGS. 3 to 9 are schematic sectional views of the photoelectric converter 11 during manufacture. The sectional views in FIGS. 3 to 9 show the portion corresponding to the cross-section in FIG. 2 during manufacture.

Figure 3:
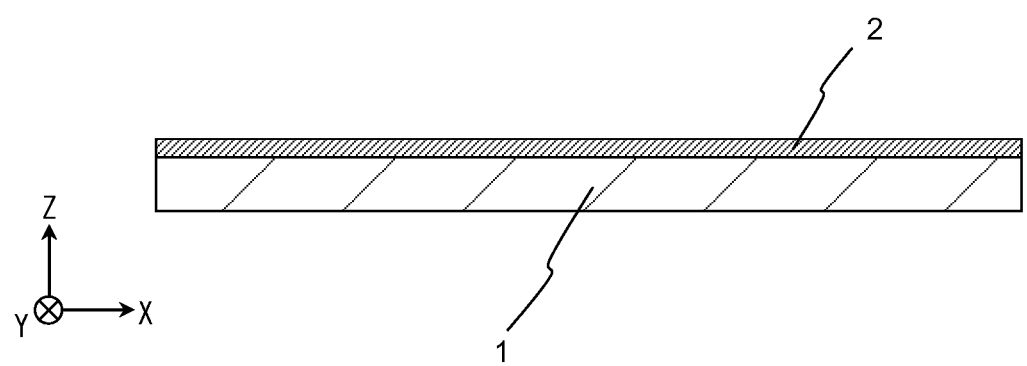
FIG. 3 is a schematic sectional view of the photoelectric converter during manufacture.
Figure 4:
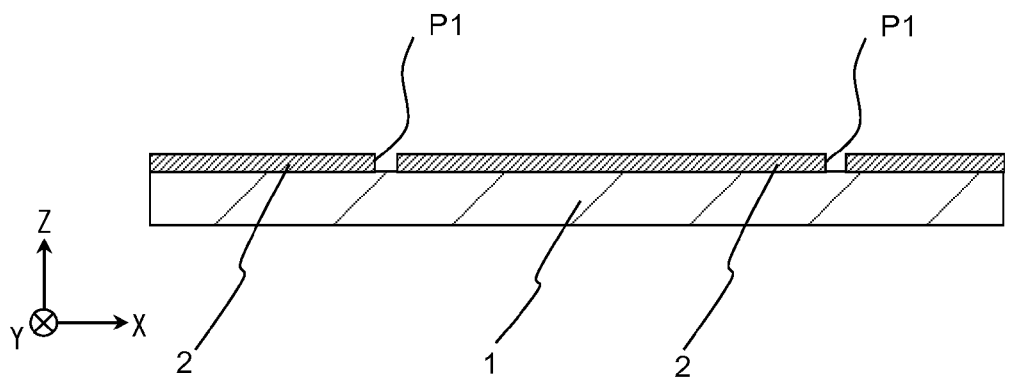
FIG. 4 is a schematic sectional view of the photoelectric converter during manufacture.

Referring first to FIG. 3, a lower electrode layer 2 of a material such as molybdenum is formed substantially over the entire surface of a cleaned substrate 1 by a process such as sputtering. The first grooves P1 are then formed from linear target regions extending in the Y direction across the top surface of the lower electrode layer 2 directly down to the top surface of the substrate 1. The first grooves P1 can be formed, for example, by scribing, i.e., a grooving process in which a laser beam such as that from a YAG laser is scanned along the target regions. FIG. 4 shows the state after the formation of the first grooves P1.

Figure 5:
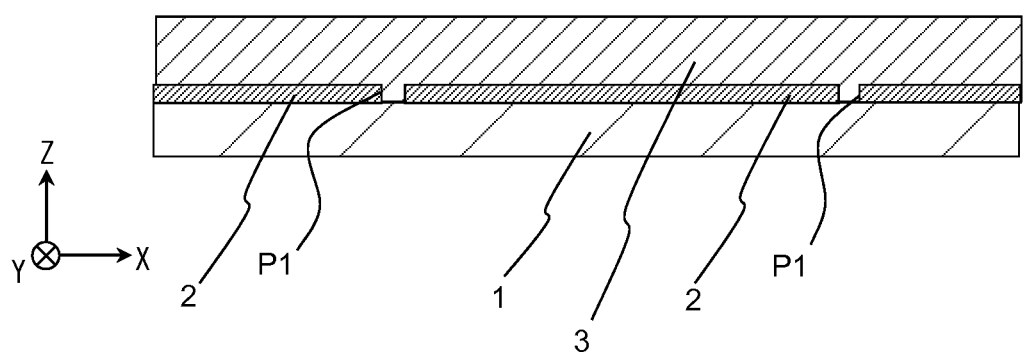
FIG. 5 is a schematic sectional view of the photoelectric converter during manufacture.

After the first grooves P1 are formed, the light-absorbing layer 3 is formed over the lower electrode layers 2. The light-absorbing layer 3 can be formed by a vacuum process such as sputtering or evaporation or by a process known as coating or printing. In a process known as coating or printing, a complex solution of the constituent elements of the light-absorbing layer 3 is applied over the lower electrode layers 2 and is then dried and heated. FIG. 5 shows the state after the formation of the light-absorbing layer 3.

Figure 6:
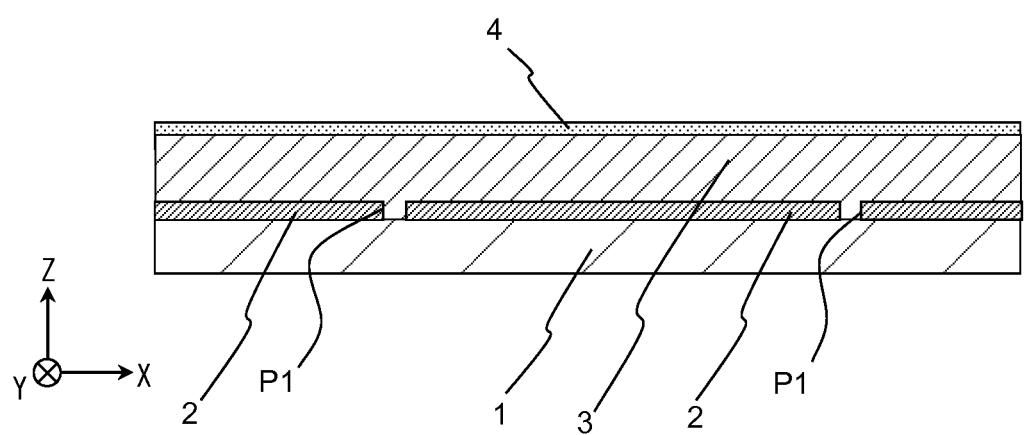
FIG. 6 is a schematic sectional view of the photoelectric converter during manufacture.

After the light-absorbing layer 3 is formed, the first buffer layer 4 is formed on the light-absorbing layer 3. The step of forming the first buffer layer 4 on the light-absorbing layer 3 is hereinafter referred to as "first step". FIG. 6 shows the state after the formation of the first buffer layer 4.

The first buffer layer 4 can be formed, for example, by a process in which the light-absorbing layer 3 is contacted with a solution containing the raw materials for the first buffer layer 4 to precipitate the first buffer layer 4 on the light-absorbing layer 3 (hereinafter referred to as "solution process"). One example solution process is chemical bath deposition (also known as CBD), in which the substrate 1 having the light-absorbing layer 3 formed thereon is immersed in a solution containing the raw materials for the first buffer layer 4 to precipitate the first buffer layer 4 on the light-absorbing layer 3. Another example solution process is coating, in which a solution containing the raw materials for the first buffer layer 4 is applied to form a coating on the light-absorbing layer 3, for example, by spin coating, screen printing, dipping, spray coating, or die coating, and is then heated to precipitate the first buffer layer 4. The term "immerse" refers to putting something in a liquid.

For CBD, for example, the substrate 1 having the light-absorbing layer 3 formed thereon may be immersed in a solution of indium chloride, thioacetamide, and hydrochloric acid in water or an alcohol, thereby forming a first buffer layer 4 containing $In_2S_3$ on the light-absorbing layer 3. Alternatively, the substrate 1 having the light-absorbing layer 3 formed thereon may be immersed in a solution of cadmium acetate, thiourea, and ammonia in water, thereby forming a first buffer layer 4 containing CdS on the light-absorbing layer 3.

For coating, for example, a solution of indium chloride and thioacetamide in methanol may be applied to form a coating on the surface of a light-absorbing layer 3 heated to 200° C. or higher, for example, by spraying, thereby forming the first buffer layer 4. The formation of the first buffer layer 4 by coating produces less liquid waste than a solution process such as CBD and will therefore contribute to a reduction in the cost of liquid waste disposal treatment and equipment.

After the first buffer layer 4 is formed, the surface of the first buffer layer 4 is contacted with a solution of an alkali metal compound (the solution of an alkali metal compound is hereinafter referred to as "first solution"). The step of contacting the surface of the first buffer layer 4 with the first solution is hereinafter referred to as "second step".

The alkali metal compound is a compound of an alkali metal element and can ionize into an alkali metal ion in a polar solvent such as water or an alcohol. Of the alkali metal elements in Group I-A (also known as Group 1) of the periodic table, lithium, sodium, potassium, rubidium, and cesium can be used. The first solution may be, for example, a solution of an alkali metal compound such as NaCl, $NaNO_3$, $NaClO_4$, $Na_2S$, NaOH, KCl, $KNO_3$, $NaClO_4$, $K_2S$, or KOH in water or an alcohol in a concentration of 1 to 100 mol/m³. The step of contacting the surface of the first buffer layer 4 with the first solution may be, for example, a step of immersing the substrate 1 having the first buffer layer 4 formed thereon in the first solution (also referred to as "dipping step") or a step of applying the first solution to the surface of the first buffer layer 4. The step of immersing the substrate 1 having the first buffer layer 4 formed thereon in the first solution is hereinafter referred to as "step of contacting by immersion". The step of applying the first solution to the surface of the first buffer layer 4 is hereinafter referred to as "step of contacting by coating".

If the step of contacting by immersion is used, the temperature of the first solution may be, for example, 20° C. to 80° C. The time for which the substrate 1 is immersed in the first solution may be, for example, 1 to 60 minutes.

If the step of contacting by coating is used, the temperature of the substrate 1 during the contacting step may be, for example, 50° C. to 250° C.

Thus, the contact of the first buffer layer 4 formed on the light-absorbing layer 3 with the first solution provides a good electrical connection between the light-absorbing layer 3 and the first buffer layer 4. Specifically, the light-absorbing layer 3 and the first buffer layer 4 can be bonded together in advance to form a good heterojunction between these two types of semiconductor layers and can then be contacted with the first solution to effectively fill defects (e.g., defects due to a lack of the Group I-B element) in the interface between the light-absorbing layer 3 and the first buffer layer 4 with an alkali metal element. This improves the photoelectric conversion efficiency of the photoelectric converter 11.

The alkali metal element present in the interface between the light-absorbing layer 3 and the first buffer layer 4 also increases the carrier concentration and thus improves the photoelectric conversion efficiency.

To further improve the photoelectric conversion efficiency, a basic solution may be used as the first solution. A basic first solution can be used under the following conditions.

If the step of contacting the surface of the first buffer layer 4 with the first solution is the step of contacting by immersion, a basic first solution having a pH of 8 to 11 can be used. This results in the diffusion rate of the alkali metal element into the first buffer layer 4 being higher than the dissolution rate of the first buffer layer 4. Specifically, while a more basic first solution promotes the diffusion of the alkali metal element into the first buffer layer 4, an even more basic first solution has a higher tendency to dissolve the first buffer layer 4. Accordingly, the conditions can be set such that the diffusion rate of the alkali metal element into the first buffer layer 4 is higher than the dissolution rate of the first buffer layer 4 to effectively diffuse the alkali metal element into the first buffer layer 4 while maintaining the crystal structure of the first buffer layer 4 in a good condition.

If the step of contacting the surface of the first buffer layer 4 with the first solution is the step of contacting by coating, a basic first solution having a pH of 8 to 13 can be used. This allows the first solution applied to the first buffer layer 4 to dissolve the surface portion of the first buffer layer 4 to a certain extent and then easily enter recesses in the surface of the first buffer layer 4. As a result, the first buffer layer 4 has a more uniform surface profile, which provides a better electrical connection between the upper electrode layer 5 and the first buffer layer 4.

In particular, the first solution may be an aqueous sodium sulfide solution, which also effectively fills defects due to a lack of the Group VI-B element in the interface between the light-absorbing layer 3 and the first buffer layer 4 and thus further improves the photoelectric conversion efficiency.

After the surface of the first buffer layer 4 is contacted with the first solution as described above, the light-absorbing layer 3 and the first buffer layer 4 may be annealed, for example, at 100° C. to 250° C. The annealing time may be, for example, 10 to 180 minutes. The annealing step further improves the photoelectric conversion efficiency.

The annealing step may be performed in a hydrogen-containing atmosphere. This further improves the photoelectric conversion efficiency. The hydrogen-containing atmosphere may be a hydrogen atmosphere or a mixed atmosphere of hydrogen and an inert gas. If the mixed atmosphere is used, the inert gas may be nitrogen or argon, and the hydrogen content of the mixed atmosphere may be 50 mol % or more.

Figure 7:
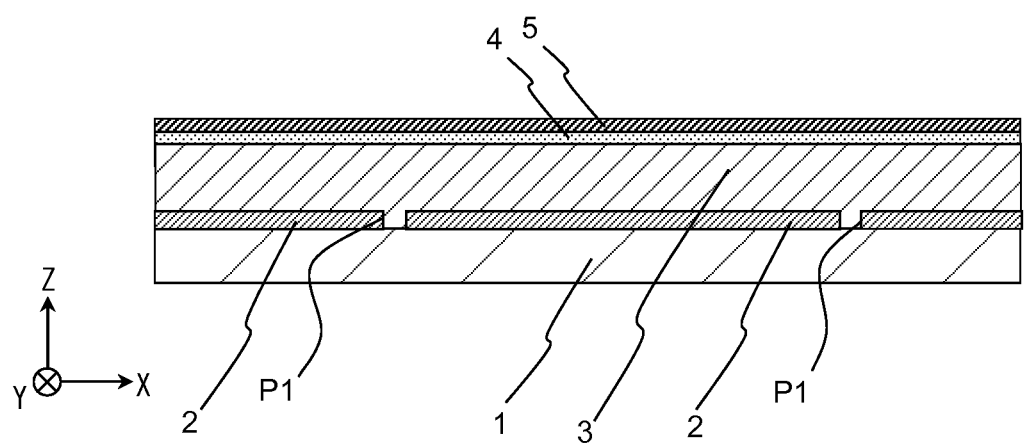
FIG. 7 is a schematic sectional view of the photoelectric converter during manufacture.

After the first buffer layer 4 is treated as described above, the upper electrode layer 5 is formed on the first buffer layer 4. The upper electrode layer 5 is, for example, a transparent conductive film based on a compound such as ITO or AZO and can be formed by a process such as sputtering, evaporation, or CVD. FIG. 7 shows the state after the formation of the upper electrode layer 5.

Figure 8:
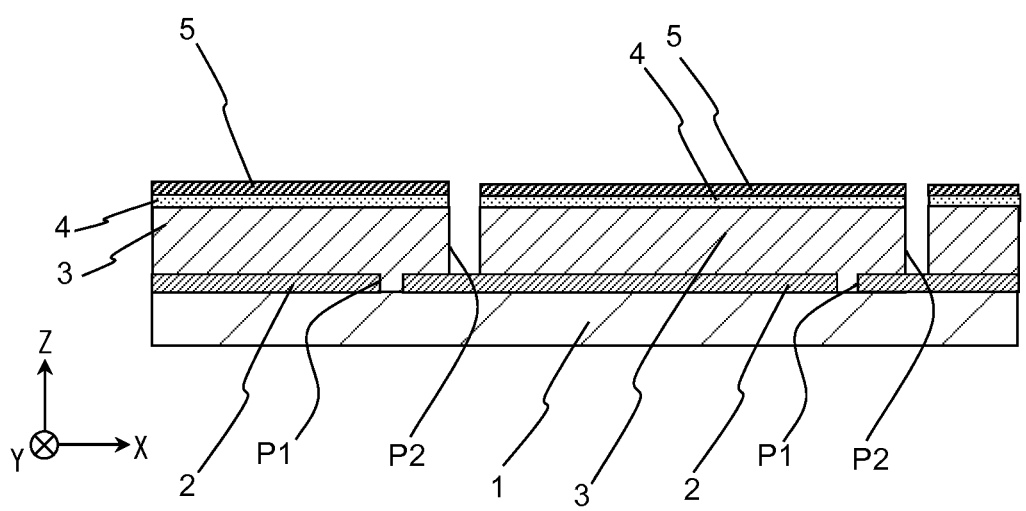
FIG. 8 is a schematic sectional view of the photoelectric converter during manufacture.

After the upper electrode layer 5 is formed, the second grooves P2 are formed from linear target regions extending in the Y direction across the top surface of the upper electrode layer 5 directly down to the top surface of the lower electrode layer 2. The second grooves P2 can be formed, for example, by repeating scribing several times consecutively with a scribing needle having a scribing width of about 40 to 50 μm while shifting the scribing needle. The second grooves P2 can also be formed by performing scribing with a scribing needle having a tip with a width close to that of the second grooves P2. The second grooves P2 can also be formed by performing scribing once or several times with two or more scribing needles fixed in contact with or close to each other. FIG. 8 shows the state after the formation of the second grooves P2. The second grooves P2 are formed at a position slightly shifted from the first grooves P1 in the X direction (in the +X direction in the drawings).

Figure 9:
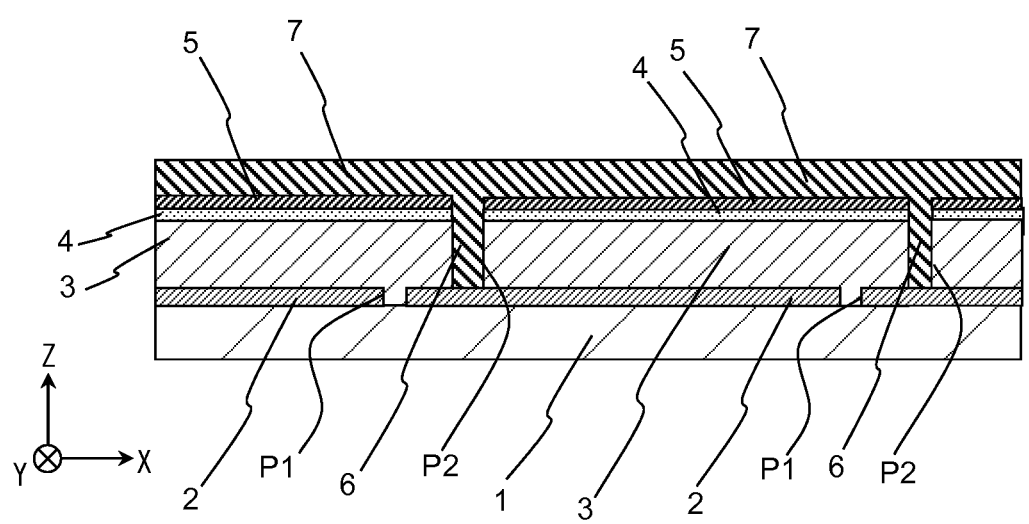
FIG. 9 is a schematic sectional view of the photoelectric converter during manufacture.

After the second grooves P2 are formed, the collector electrodes 7 and the connection conductors 6 are formed. The collector electrodes 7 and the connection conductors 6 can be formed, for example, by applying a paste having conductivity (also referred to as "conductive paste") prepared by dispersing a metal powder such as silver powder in a material such as a resin binder by printing in a desired pattern and then heating the paste. FIG. 9 shows the state after the formation of the collector electrodes 7 and the connection conductors 6.

After the collector electrodes 7 and the connection conductors 6 are formed, the third grooves P3 are formed from linear target regions extending across the top surface of the upper electrode layer 5 directly down to the top surface of the lower electrode layer 2. The third grooves P3 may have a width of, for example, about 40 to 1,000 μm. As with the second grooves P2, the third grooves P3 may be formed by mechanical scribing. Thus, the formation of the third grooves P3 completes the fabrication of the photoelectric converter 11 shown in FIGS. 1 and 2.

The present invention is not limited to the above embodiment, but various changes and improvements are possible without departing from the spirit of the present invention. For example, the following modifications may be employed.

<(3) First Modification of Method for Manufacturing Photoelectric Converter>

A step of etching the surface portion of the first buffer layer 4 may be provided between the first step of forming the first buffer layer 4 and the second step of contacting the surface of the first buffer layer 4 with the first solution. This allows the first solution to easily enter the first buffer layer 4 in the second step. That is, the etching of the surface portion of the first buffer layer 4 makes uniform (smooth) the surface condition (surface profile) of the first buffer layer 4 so that the first solution easily and evenly enters the first buffer layer 4.

In the step of etching the surface portion of the first buffer layer 4, the surface portion of the first buffer layer 4 may be etched to a depth of about 5% to 20% of the thickness of the first buffer layer 4 after the first step.

The surface portion of the first buffer layer 4 may be etched by wet etching, for example, with an etchant, or by dry etching, for example, with an etching gas, ions, or radicals. In particular, wet etching may be used, which simplifies the manufacturing apparatus.

The etchant used for wet etching may be an acidic aqueous solution with a pH of about 1 to 3, such as hydrochloric acid, or an alkaline aqueous solution with a pH of about 8 to 13, such as aqueous ammonia.

Wet etching may be performed by immersing the substrate 1 having the first buffer layer 4 formed thereon in the etchant or by applying the etchant to the surface of the first buffer layer 4, for example, by spraying. If the etchant is applied to the surface of the first buffer layer 4, the applied etchant etches the surface portion of the first buffer layer 4 and then easily enters recesses in the surface of the first buffer layer 4. Thereafter, heat treatment is performed to evaporate any excess solvent from the surface and interior of the first buffer layer 4. This process allows the first buffer layer 4 to have a smoother surface profile. This method also produces less or no waste etchant and thus requires a simpler process.

<(4) Second Modification of Method for Manufacturing Photoelectric Converter>

Figure 10:
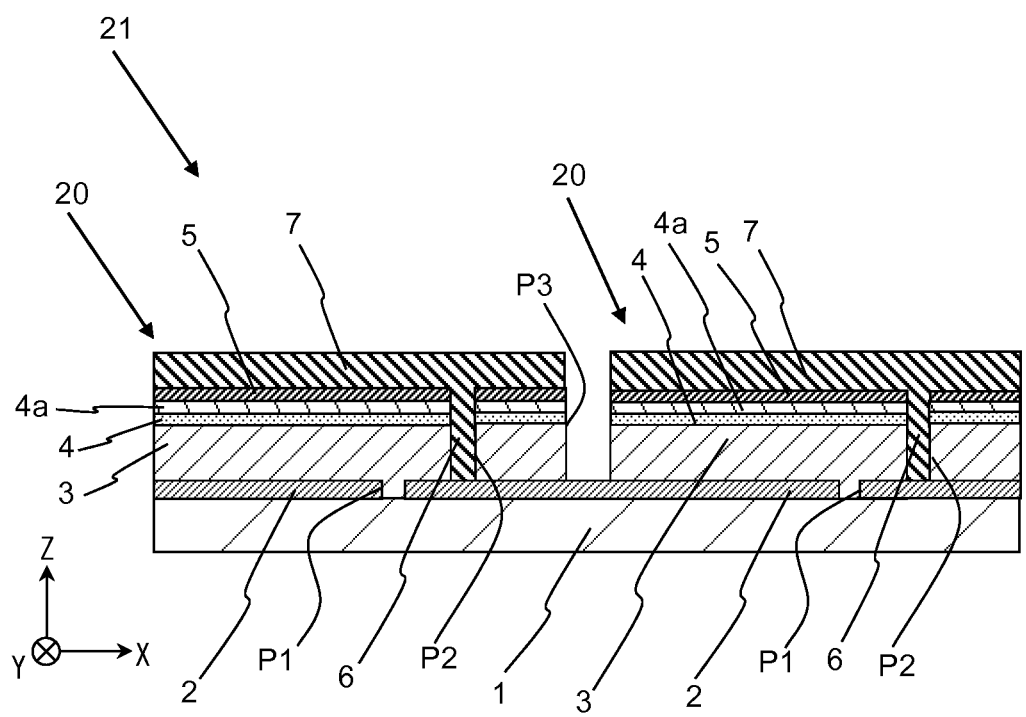
FIG. 10 is a sectional view of another example photoelectric converter.

As shown in FIG. 10, a step of forming a second buffer layer 4a containing a metal sulfide on the first buffer layer 4 may be provided after the second step of contacting the surface of the first buffer layer 4 with the first solution. This allows the alkali metal element to be more easily absorbed into the buffer layer composed of the first buffer layer 4 and the second buffer layer 4a.

FIG. 10 is a sectional view of another example photoelectric converter 21. The same parts as those in the photoelectric converter 11 shown in FIGS. 1 and 2 are indicated by the same reference signs. The photoelectric converter 21 shown in FIG. 10 differs from the photoelectric converter 11 shown in FIGS. 1 and 2 in that the second buffer layer 4a is formed on the first buffer layer 4.

As with the first buffer layer 4, the second buffer layer 4a can be formed by a solution process (CBD or coating). The first buffer layer 4 and the second buffer layer 4a may have the same or different compositions.

In particular, the second buffer layer 4a may be formed by coating after the second step of contacting the surface of the first buffer layer 4 with the first solution is performed by the step of contacting by coating so that the alkali metal element can be more easily and stably absorbed into the buffer layer and the first solution can be more efficiently utilized.

After the second buffer layer 4a is formed, the second step and a buffer-layer forming step may be repeated once or more.

EXAMPLE 1

The method for manufacturing the photoelectric converter 11 is further illustrated by the following example.

A raw material solution for the light-absorbing layer 3 was prepared first. The raw material solution was a solution of a single-source precursor prepared in accordance with the specification of U.S. Pat. No. 6,992,202 in pyridine. The single-source precursor was a mixture of a complex molecule of copper, indium, and phenylselenol and a complex molecule of copper, gallium, and phenylselenol.

A plurality of glass substrates 1 having a molybdenum lower electrode layer 2 formed thereon were then prepared. The raw material solution was applied with a blade to form a coating on the lower electrode layer 2.

The coating was then heated at 550° C. in a hydrogen gas atmosphere containing selenium vapor with a partial pressure ratio of 20 ppmv for 1 hour to form a light-absorbing layer 3 based on CIGS and having a thickness of 2 μm.

The substrates having the light-absorbing layer 3 formed thereon were then immersed in a solution of cadmium acetate and thiourea in aqueous ammonia to form a first buffer layer 4 containing CdS and having a thickness of 50 nm on the light-absorbing layer 3.

The substrates having the first buffer layer 4 formed thereon were treated under the following four different sets of conditions.

For conditions 1-1, a solution of 10 mol/m$^3$ Na$_2$S in water (solution temperature: 60° C.) was prepared as the first solution. A substrate having the first buffer layer 4 formed thereon was immersed in the first solution for 30 minutes (sample 1).

For conditions 1-2, a solution of 20 mol/m$^3$ NaCl in water (solution temperature: 60° C.) was prepared as the first solution. Another substrate having the first buffer layer 4 formed thereon was immersed in the first solution for 30 minutes (sample 2).

For conditions 1-3, a solution of 20 mol/m$^3$ NaCl in water (solution temperature: 60° C.) whose pH was adjusted to 11 with NaOH was prepared as the first solution. Another substrate having the first buffer layer 4 formed thereon was immersed in the first solution for 30 minutes (sample 3).

For conditions 1-4, another substrate having the first buffer layer 4 formed thereon was not treated with a first solution containing an alkali metal compound; it is for comparison purposes (sample 4).

An aluminum-doped ZnO upper electrode layer was formed on the first buffer layer 4 of each of samples 1 to 4 by sputtering to fabricate four types of photoelectric converters.

The photoelectric conversion efficiency of Samples 1 to 4, fabricated as described above, was measured as follows. The photoelectric conversion efficiency was measured using a steady-state solar simulator at an irradiance of 100 mW/cm$^2$ on the light-receiving surface of the photoelectric converter and an air mass (AM) of 1.5. As a result, whereas sample 4, which is for comparison purposes, had a photoelectric conversion efficiency of 13.5%, sample 1 had a photoelectric conversion efficiency of 15%, sample 2 had a photoelectric conversion efficiency of 14%, and sample 3 had a photoelectric conversion efficiency of 15%. These results demonstrate that samples 1 to 3, which were contacted with a first solution containing an alkali metal compound, had higher photoelectric conversion efficiencies. In particular, the results demonstrate that the use of an aqueous Na$_2$S solution as the first solution and the use of a basic alkali metal compound solution resulted in an even higher photoelectric conversion efficiency.

EXAMPLE 2

The method for manufacturing the photoelectric converter 11 is further illustrated by the following other example.

A plurality of substrates having a CIGS-containing light-absorbing layer 3 formed thereon were first prepared as in Example 1.

These substrates were then immersed in a solution of indium chloride and thiourea in water to form a first buffer layer 4 containing indium sulfide and having a thickness of 50 nm on the light-absorbing layer 3.

The substrates having the first buffer layer 4 formed thereon were treated under the following five different sets of conditions.

For conditions 2-1, a solution of 2.5 mol/m$^3$ Na$_2$S in water (solution temperature: 60° C.) was prepared as the first solution. A substrate having the first buffer layer 4 formed thereon was immersed in the first solution for 30 minutes. Thereafter, the substrate was annealed at 170° C. for 1 hour (sample 5).

For conditions 2-2, a solution of 2.5 mol/m$^3$ Na$_2$S in water (solution temperature: 60° C.) was prepared as the first solution. A substrate having the first buffer layer 4 formed thereon was immersed in the first solution for 30 minutes. Thereafter, the substrate was annealed at 200° C. for 1 hour (sample 6).

For conditions 2-3, a solution of 2.5 mol/m$^3$ Na$_2$S in water (solution temperature: 60° C.) was prepared as the first solution. A substrate having the first buffer layer 4 formed thereon was immersed in the first solution for 30 minutes. Thereafter, the substrate was annealed at 225° C. for 1 hour (sample 7).

For conditions 2-4, a solution of 2.5 mol/m$^3$ Na$_2$S in water (solution temperature: 60° C.) was prepared as the first solution. A substrate having the first buffer layer 4 formed thereon was immersed in the first solution for 30 minutes. Thereafter, the substrate was annealed at 250° C. for 1 hour (sample 8).

For conditions 2-5, a solution of 2.5 mol/m$^3$ Na$_2$S in water (solution temperature: 60° C.) was prepared as the first solution. A substrate having the first buffer layer 4 formed thereon was immersed in the first solution for 30 minutes. Thereafter, the substrate was not annealed (sample 9).

For conditions 2-6, a substrate having the first buffer layer 4 formed thereon was not treated with a first solution containing an alkali metal compound or annealed; it is for comparison purposes (sample 10).

An aluminum-doped ZnO upper electrode layer was formed on the first buffer layer 4 of each of samples 5 to 9 by sputtering to fabricate five types of photoelectric converters.

The photoelectric conversion efficiency of samples 5 to 9, fabricated as described above, was measured as in Example 1. As a result, whereas sample 10, which is for comparison purposes, had a photoelectric conversion efficiency of 13.8%, sample 5 had a photoelectric conversion efficiency of 14.9%, sample 6 had a photoelectric conversion efficiency of 15.3%, sample 7 had a photoelectric conversion efficiency of 15.4%, sample 8 had a photoelectric conversion efficiency of 15.1%, and sample 9 had a photoelectric conversion efficiency of 14.5%. These results demonstrate that samples 5 to 9, which were contacted with a first solution containing an alkali metal compound, had higher photoelectric conversion efficiencies. The results also demonstrate that samples 5 to 8, which were annealed after being contacted with the first solution, had even higher photoelectric conversion efficiencies.

REFERENCE SIGNS LIST 1 substrate
2 lower electrode layer
3 light-absorbing layer
3 first buffer layer
4a second buffer layer
5 upper electrode layer
6 connection conductor
7 collector electrode
10, 20 photoelectric cell
11, 21 photoelectric converter

The invention claimed is:
1. A method for manufacturing a photoelectric converter, comprising:
   forming a first buffer layer comprising a metal sulfide on a light-absorbing layer comprising a Group I-III-VI compound or a Group I-II-IV-V I compound; and
   contacting a surface of the first buffer layer with a first solution comprising an alkali metal compound and having a pH of 8 to 11 by immersing the first buffer layer in the first solution.
2. The method for manufacturing a photoelectric converter according to claim 1, wherein the alkali metal compound is sodium sulfide.

3. The method for manufacturing a photoelectric converter according to claim 1, further comprising, after the contacting, annealing the light-absorbing layer and the first buffer layer.

4. The method for manufacturing a photoelectric converter according to claim 3, wherein the annealing is performed in an atmosphere comprising hydrogen.

5. The method for manufacturing a photoelectric converter according to claim 1, further comprising, between the forming and the contacting, etching a surface portion of the first buffer layer.

6. The method for manufacturing a photoelectric converter according to claim 1, further comprising, after the contacting, forming a second buffer layer comprising a metal sulfide on the first buffer layer.

\* \* \* \* \*